United States Patent
Fung et al.

(10) Patent No.: US 6,355,501 B1
(45) Date of Patent: Mar. 12, 2002

(54) THREE-DIMENSIONAL CHIP STACKING ASSEMBLY

(75) Inventors: Ka Hing Fung, Beacon; H. Bernhard Pogge, Hopewell Junction, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/666,767

(22) Filed: Sep. 21, 2000

(51) Int. Cl.$^7$ .............................................. H01L 21/44
(52) U.S. Cl. ....................... 438/107; 438/109; 438/455
(58) Field of Search ................................ 438/107, 108, 438/109, 455, 458, 149, 151

(56) References Cited

U.S. PATENT DOCUMENTS

| | | | |
|---|---|---|---|
| 5,426,072 A | | 6/1995 | Finnila ........................ 437/208 |
| 5,880,010 A | * | 3/1999 | Davidson .................... 438/455 |
| 5,923,067 A | * | 7/1999 | Voldman ..................... 257/349 |
| 5,985,693 A | * | 11/1999 | Leedy ......................... 438/107 |
| 6,252,300 B1 | * | 6/2001 | Hsuan et al. ............... 257/686 |

* cited by examiner

Primary Examiner—Kevin M. Picardat
(74) Attorney, Agent, or Firm—H. Daniel Schnurmann

(57) ABSTRACT

An assembly consisting of three dimensional stacked SOI chips, and a method of forming such integrated circuit assembly, each of the SOI chips including a handler making mechanical contact to a first metallization pattern making electrical contact to a semiconductor device. The metalized pattern, in turn, contacts a second metallization pattern positioned on an opposite surface of the semiconductor device. The method of fabricating the three-dimensional IC assembly includes the steps of: a) providing a substrate having a third metalized pattern on a first surface of the substrate; b) aligning one of the SOI chips on the first surface of the substrate, by having the second metallization pattern of the SOI chip make electrical contact with the third metalized pattern of the substrate; c) removing the handler from the SOI chip, exposing the first metallization pattern of the SOI chip; d) aligning a second one of the SOI chips with the first SOI chip, having the second metallization pattern of the second SOI chip make electrical contact to the exposed first metallization pattern of the first SOI chip; and e) repeating steps c) and d) for mounting subsequent SOI chips one on top of the other.

12 Claims, 13 Drawing Sheets

THREE-DIMENSIONAL CHIP STACKING ASSEMBLY

FIELD OF THE INVENTION

This invention is generally related to the fabrication of a three-dimensional integrated circuit (IC) chip or wafer assembly, and more particularly to a method of stacking ultra-thin chips with interconnections designed to maximize the speed of the overall IC package.

BACKGROUND OF THE INVENTION

Three-dimensional integrated circuits (3D-IC) have proven to be the favored approach for improving the performance of semiconductor products. Density can be upgraded many fold by stacking chips or wafers. Significant speed improvement can also be expected because the interconnecting wires linking the chips are shortened substantially.

Several techniques for achieving 3D-IC configurations have been used in the past. One approach utilizes a fabrication technology wherein active silicon films are grown in successive layers with intervening insulation layers. However, this approach must overcome many problems related to the materials used. Furthermore, the processes involved in forming successively devices can affect the characteristics of devices placed underneath it. In addition, the total fabrication time and complexity is proportional to the number of layers, and becomes impractical for higher levels of 3D integration. A typical technique of forming a 3D-IC assembly by stacking silicon-on-insulator (SOI) wafers, but using a temporary silicon substrate, is described, e.g., in U.S. Pat. No. 5,426,072 to Finnila. are several problems associated with stacking wafers. First, the yield loss is very large. Assuming a typical 70% yield for each finished wafer, by stacking two wafers, the maximum yield achievable is 49%, (i.e., 0.7x0.7), assuming no yield loss in the stacking process. A low yield forcibly results in a significant increase in cost. The second problem is related to alignment. Nowadays, almost all lithographic processes use optical steppers. The stepper only aligns and exposes one die at a time. Thus, images in different die areas do not aligned, as a result of which it is a common occurrence that the two wafers end up misaligned. To solve this problem, the feature size of the interconnect required for stacking needs to be very large which, in turn, degrades the density and performance of the 3D-IC.

Since the chips in each wafer are tested to screen out defective ones, one must stack only good chips on top of good chips on a wafer to maintain a reasonable yield. If there is no yield loss during the stacking process, the final yield will coincide with the original wafer yield. In as much as one or more chips need to be aligned at any one time, the alignment tolerance is significantly superior than stacking wafers on top of one another. Hence, stacking chips is definitely the preferred approach for attaining 3D-IC.

In order to achieve the desired results, optical alignment has been used extensively in today IC technology. Optical alignment can be used as long as the alignment marks on both dies are visible. This is feasible, as will be explained hereinafter. Alternatively, an electrical alignment can be utilized, although it requires additional circuitry to realize this alignment. A distinct advantage resides in the ability of this optical technique to align with tolerances close to the minimum feature size of the technology. Lastly, to extend 3D-IC to as many layers as possible, metal must be present in the topmost and lowermost layer of the wafer. As described below, it is much easier to fabricate fine metal patterns on the bottomside of the wafer using SOI technology than bulk technology. It is also extremely difficult to achieve very thin stacking chip (<10 micron) using bulk CMOS technology.

Figure 1A:
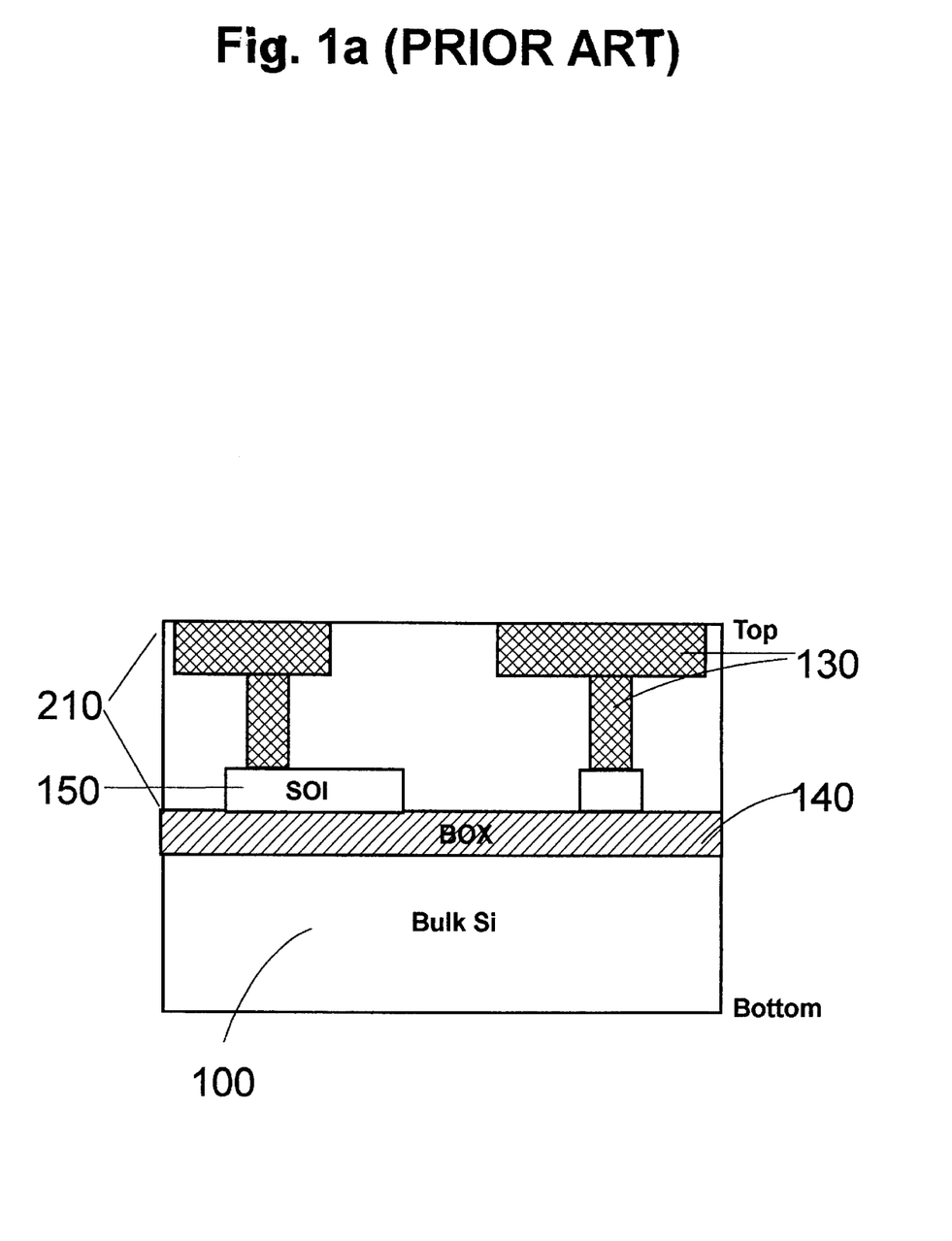
FIGS. 1a–1e show the process steps leading to the fabrication of a prior art SOI wafer with a handling substrate on top of multi-layer metal positioned above an SOI layer, placed on top of the BOX and finally a second set of multi-layer metal positioned underneath the BOX.
Figure 1B:
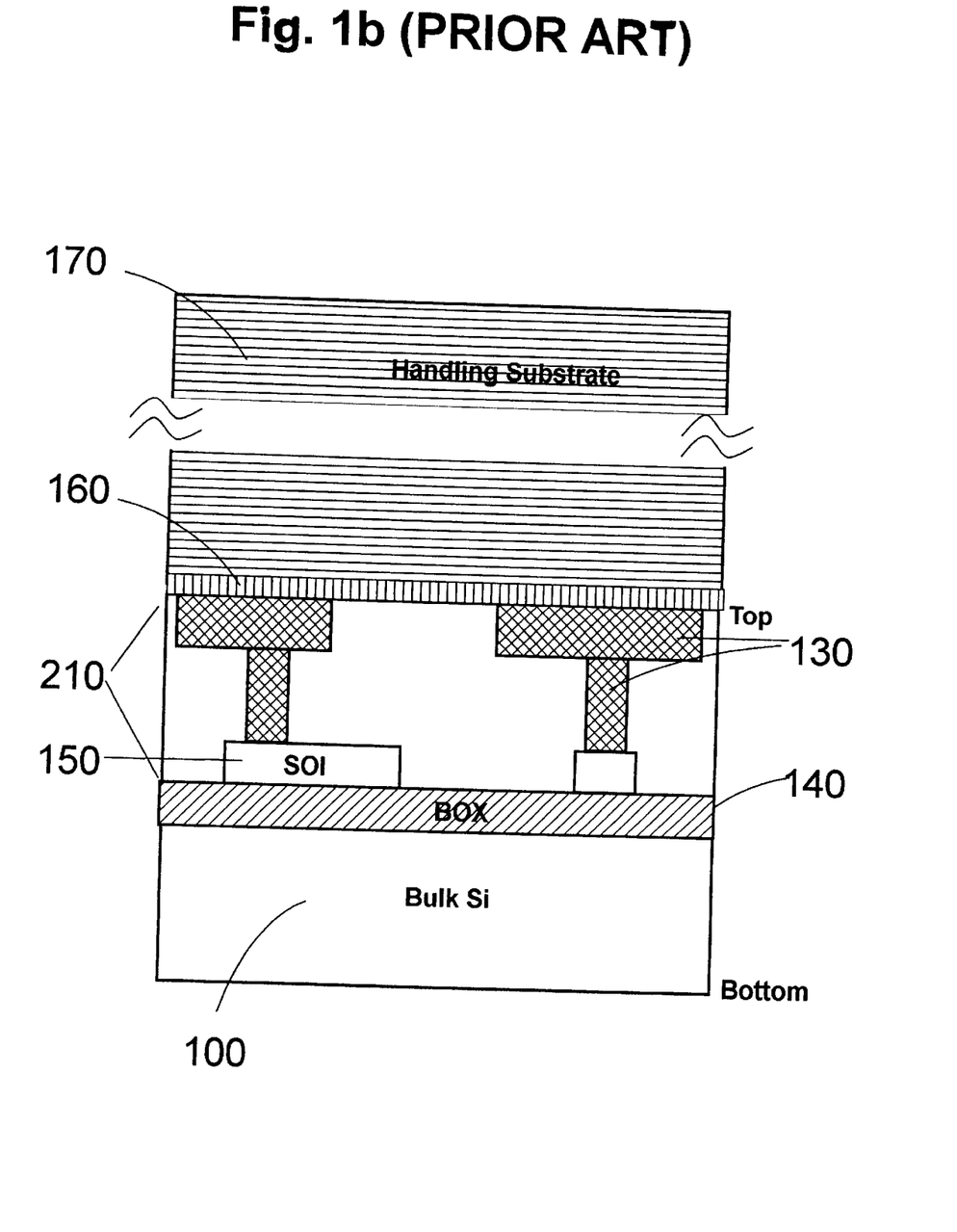

In order to better understand the structure of the present invention, a description of the steps to prepare a wafer to form the structure of the present invention will be described next with reference to FIG. 1a to FIG. 1e. Details of such construction may be found in U.S. patent application Ser. No. 09/481,914, filed on Jan. 12, 2000, and incorporated herein by reference. Therein, an SOI wafer consisting of an SOI silicon substrate (100), a buried oxide layer (BOX) (140), an SOI film (150) and multi-layer metal (130) above the SOI is shown in FIG. 1a. Active and passive device components are built on the SOI above the BOX. The wafer can be fabricated using CMOS technology, bipolar technology, GaAs technology, optical devices or any other technology. The buried oxide (140) and the bulk-Si substrate (100) can be replaced with other dielectric material as long as one can remove the thick substrate and stop exactly on the buried dielectric. An optional metal layer below the BOX may be needed to minimize the resistance of the interconnections between stacked chips. Next, a handling wafer (170) is attached at the topmost layer of the wafer (210), as shown in FIG. 1b. This handler is preferably made of silicon or glass, having a thickness adequate for mechanical handling (e.g., for an 8 inch wafer, the thickness is in the order of 0.5mm). The handler has preferably the same shape as the wafer and has its edges aligned with the wafer edges. Glue (160) which is utilized must withstand temperatures of up to around 400° C. because of the later buried metallization process. The handling substrate consists of bulk material, SOI or glass, although glass is preferable because of its transparency, and further, it makes it possible to use optical alignment to stack the chips. The glue is preferably also made of a transparent material as well. For the purpose of chip stacking, it is preferable to remove the handler after each stacking process. As a result, the glue material has to be chosen such that it can facilitate the handler removal process and expose the upper metal layer. One way of accomplishing this is by using polyimide as the glue material. A laser beam passing through the glass can be focused on the polyimide, locally melting it and allowing the handling substrate to be removed with ease.

Figure 1C:
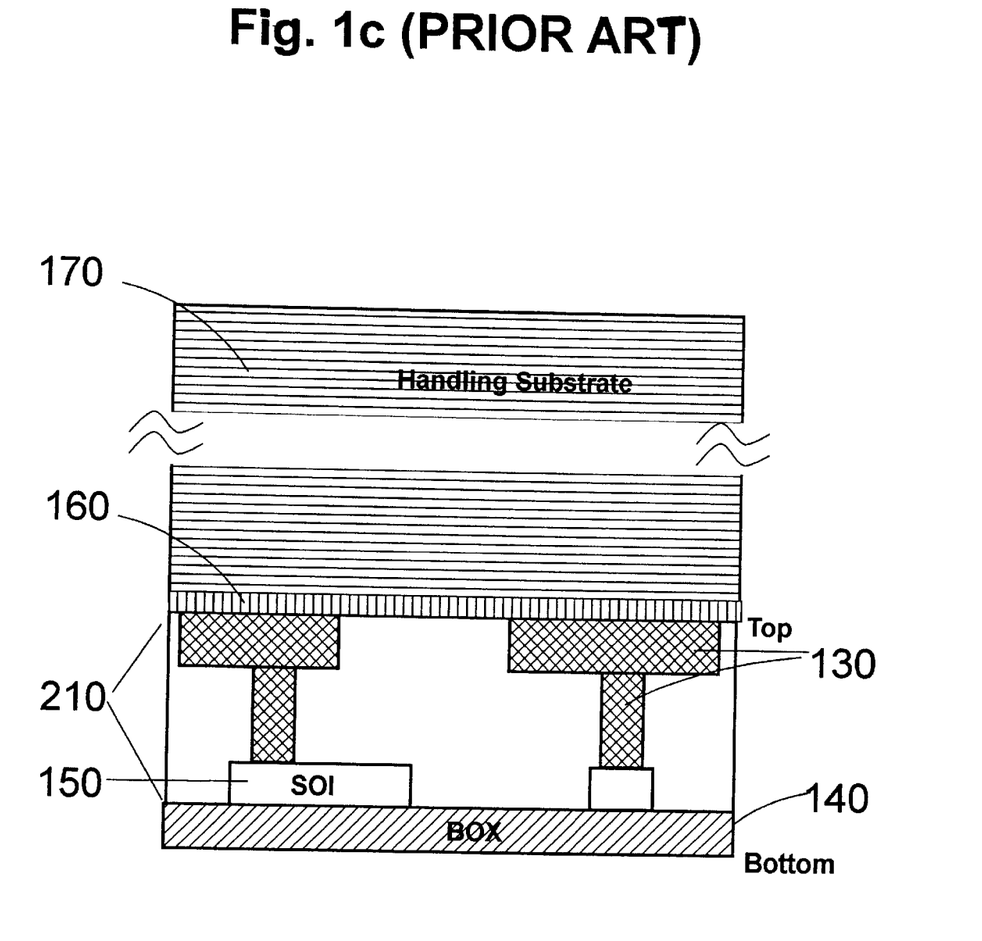

In FIG. 1c, the bulk silicon (100) is removed by a chemical and/or mechanical grinding process until the buried oxide (BOX) (140) is exposed. Such etch back process is similar to the one developed for bond-and-etch-back SOI process, known in the art, except that now the chemical etch, usually KOH, a potassium-hydroxide solution, conveniently stops at the buried oxide. This results in a perfectly flat and clean oxide surface. The chemical etching must be the last etching step because the mechanical grinding does not stop on oxide. The high quality buried oxide (BOX) is critical in the formation of such flat and clean oxide surface at the bottom. This surface is essential for allowing the usage of high resolution lithography to maximize the number of feedthroughs from the top-side and bottom-side of the chip. The perfect chemical etch stop also allows the stacking chip to be extremely thin (less than 10 micron). Without the BOX layer (in case of bulk technology), a timing etching or grinding process can be used. However, the bottom surface is rough and the stacking chip significantly thick (100 microns and above). Therefore, it is important to emphasize that the present invention employs SOI material as well as an innovative processing technique to achieve ultra-thin stacking chip as well as maximizing the number of interconnections between the stacked chips.

Figure 1D:
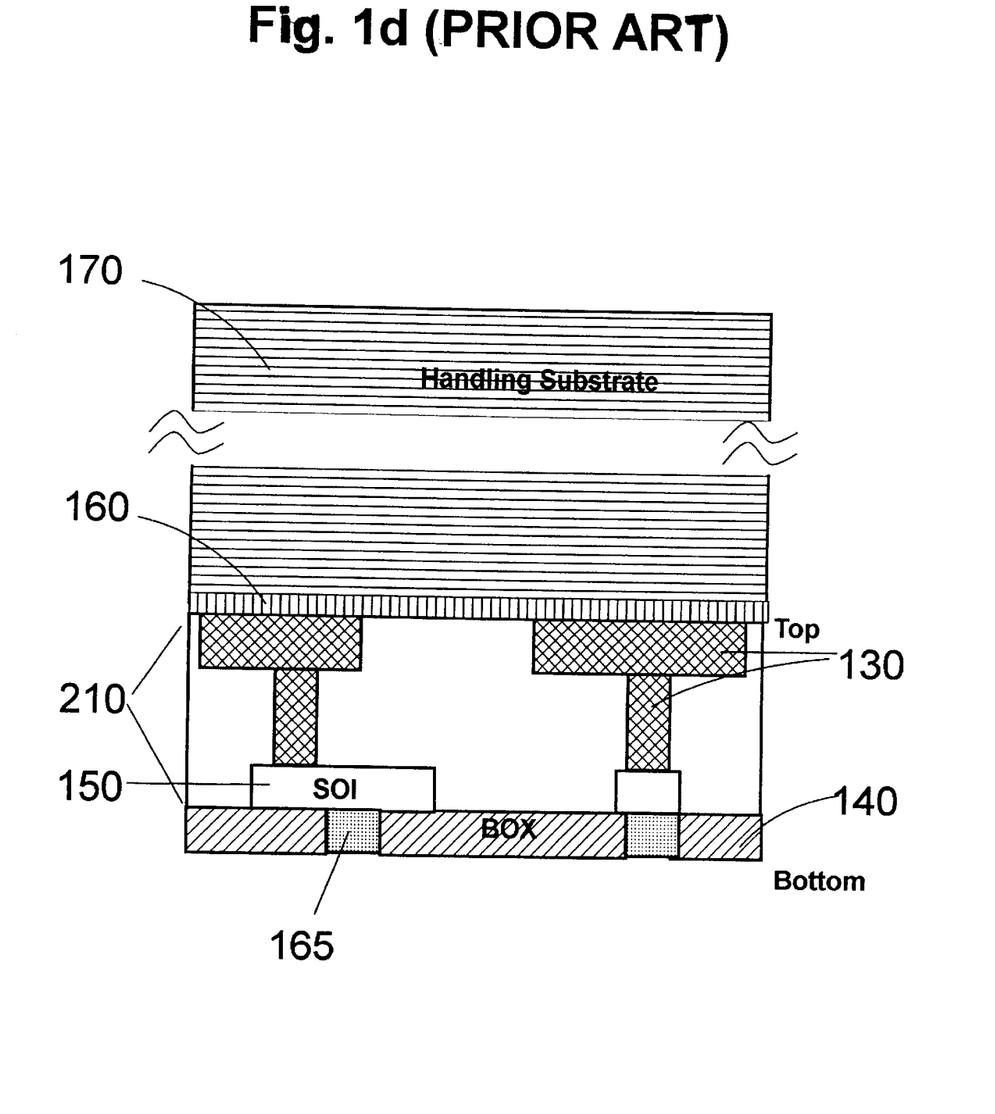
Figure 1E:
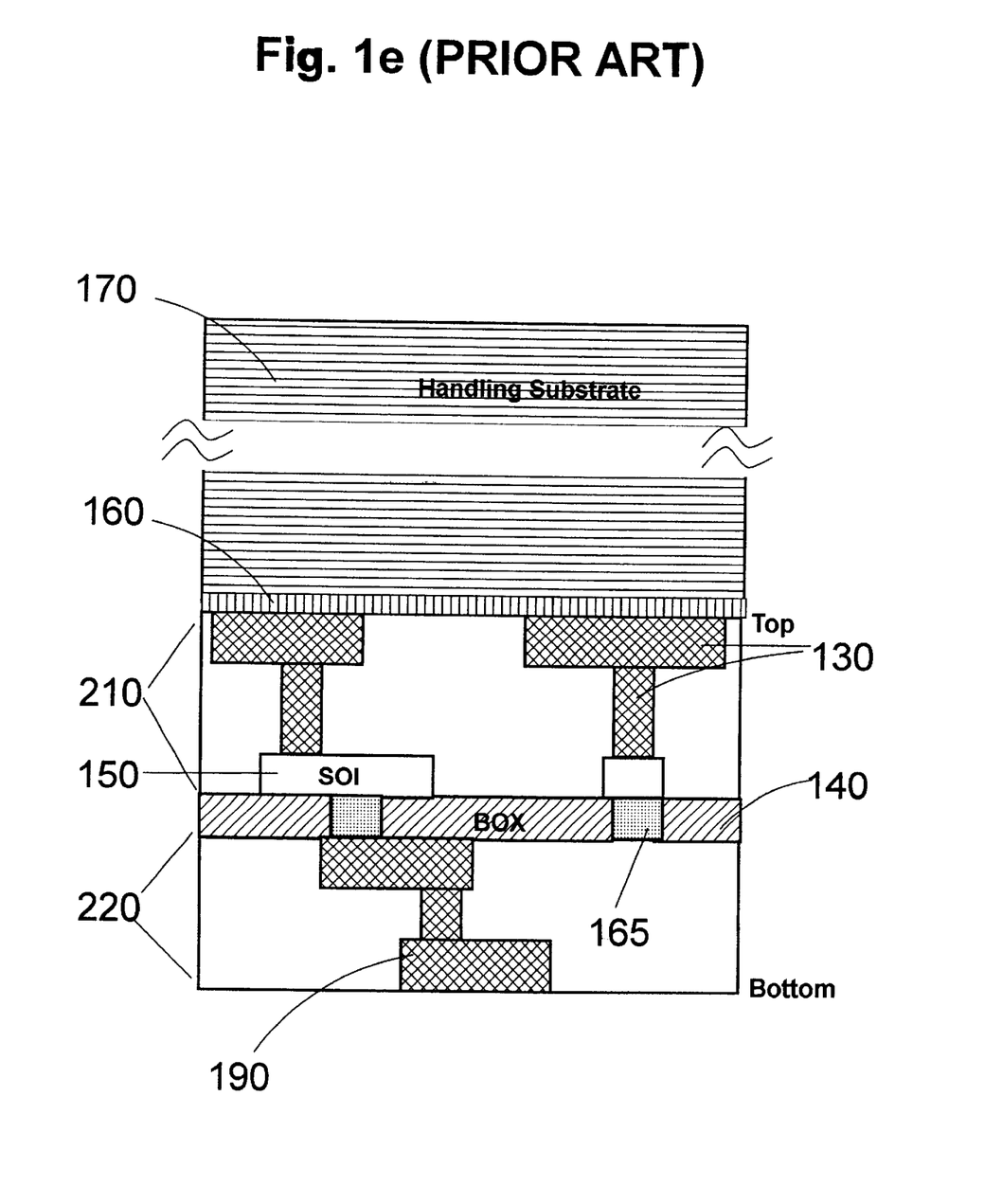

In FIG. 1d, a standard lithography process opens the via for etching. The via is aligned to the front side pattern of the original wafer. The buried oxide is typically 100–300nm, making it for all practical purposes transparent. The via mask is mirrored for proper alignment. The oxide in the opening area is then removed using an etching technique, such as RIE. The via opening (165) is then filled with suitable plug material, preferably metal, such as tungsten. If the opening is sufficiently wide, metal (aluminum or copper) can be formed by a single damascene process. In FIG. 1e, multilayer metal (190) (preferably, Cu or Al) is formed below the BOX (140) by conventional metal deposition and etching. These metal layers interconnect the vias positioned in the BOX layer. The last metal layer is provided with an appropriate structure for proper chip attachment, which will be discussed in more detail hereinafter. For ease of discussion, the multilayer metal (130) described above the SOI is assumed to be the topmost layer to be used for metal routing, whereas the multilayer metal below (190) the BOX is assumed to be the bottommost layer providing metal routing.

OBJECTS OF THE INVENTION

Accordingly, it is an object of the invention to fabricate a 3D-IC structure by stacking chips on a wafer or a chip on top of another chip.

It is another object of the invention to use an SOI buried metal process to provide interconnections at the substrate interface to allow a continuous stacking of any number of chips.

It is a further object of the invention to stack the chips while maintaining a precise alignment between all the chips forming the stack.

It is yet another object of the invention to stack chips one on top of another while maintaining good mechanical and thermal integrity.

SUMMARY OF THE INVENTION

The objects of the invention are realized by providing a method of fabricating a three-dimensional integrated circuit (IC) assembly, the assembly being formed by a plurality of individual SOI chips, each of the SOI chips including: a handler making mechanical contact to a first metallization pattern, the first metallization pattern making an electrical contact to a semiconductor device, the semiconductor device making electrical connect to a second metallization pattern positioned on an opposite surface of the semiconductor device, the method of fabricating the three-dimensional IC assembly including the steps of: a) providing a substrate having a third metalized pattern on a first surface of the substrate; b) aligning one of the SOI chips on the first surface of the substrate by having the second metallization pattern of the SOI chip make electrical contact with the third metalized pattern of the substrate; c) removing the handler from the SOI chip, exposing the first metallization pattern of the SOI chip; d) aligning a second one of the SOI chips with the first SOI chip and having the second metallization pattern of the second SOI chip make electrical contact to the exposed first metallization pattern of the first SOI chip; and e) repeating steps c) and d) for mounting subsequent SOI chips one on top of another.

In another aspect of the invention, there is provided a three-dimensional integrated circuit (IC) assembly, the assembly formed by a plurality of individual SOI chips, each of the SOI chips comprising a handler making mechanical contact to a first metallization pattern, the first metallization pattern making an electrical contact to a semiconductor device, the semiconductor device making an electrical connect to a second metallization pattern positioned on an opposite surface of the semiconductor device, the three-dimensional IC assembly including: a) a substrate having a third metalized pattern on a first surface of the substrate; b) a first plurality of SOI chips positioned on the first surface of the substrate with the second metallization pattern of the SOI chip making electrical contact with the third metalized pattern of the substrate; c) with the handler removed from the SOI chip and with the first metallization pattern of the SOI chip exposed, a second plurality of the SOI chips aligned with the first plurality of SOI chips, wherein the second metallization pattern of the second SOI chip makes electrical contact with the exposed first metallization pattern of the first SOI chip; and d) subsequent levels of aligned SOI chips, each of the levels of SOI chips being placed and aligned on top of a previous level of the SOI chips until a predetermined height of the stack of SOI chips is reached.

In summary, there is disclosed a three-dimensional integrated circuit (3D-IC) assembly consisting of a plurality of wafers stacked one on top of the other. This assembly further extends to include stacking chips on a wafer or chips on top of another chip on top of any type of substrate, card, interposer, and the like. Finally, an SOI buried metal process is described that provides the necessary interconnections at the substrate interface, making it possible to successively stack any number of chips. In order to properly stack all the chips as described, a precise alignment between all the chips forming the stack is required to maintain good mechanical and thermal integrity.

DESCRIPTION OF THE DRAWINGS

These and other objects, advantages and aspects of the invention will be better understood by the following detailed description of a preferred embodiment when taken in conjunction with the accompanying drawings.

DESCRIPTION OF THE INVENTION

Having by now described the wafer preparation process, the chip alignment and the attachment process applicable to a multi-layer chip stacking technology will be described hereinafter. This description will then be followed by an illustrative example.

Chip Stacking

Figure 2:
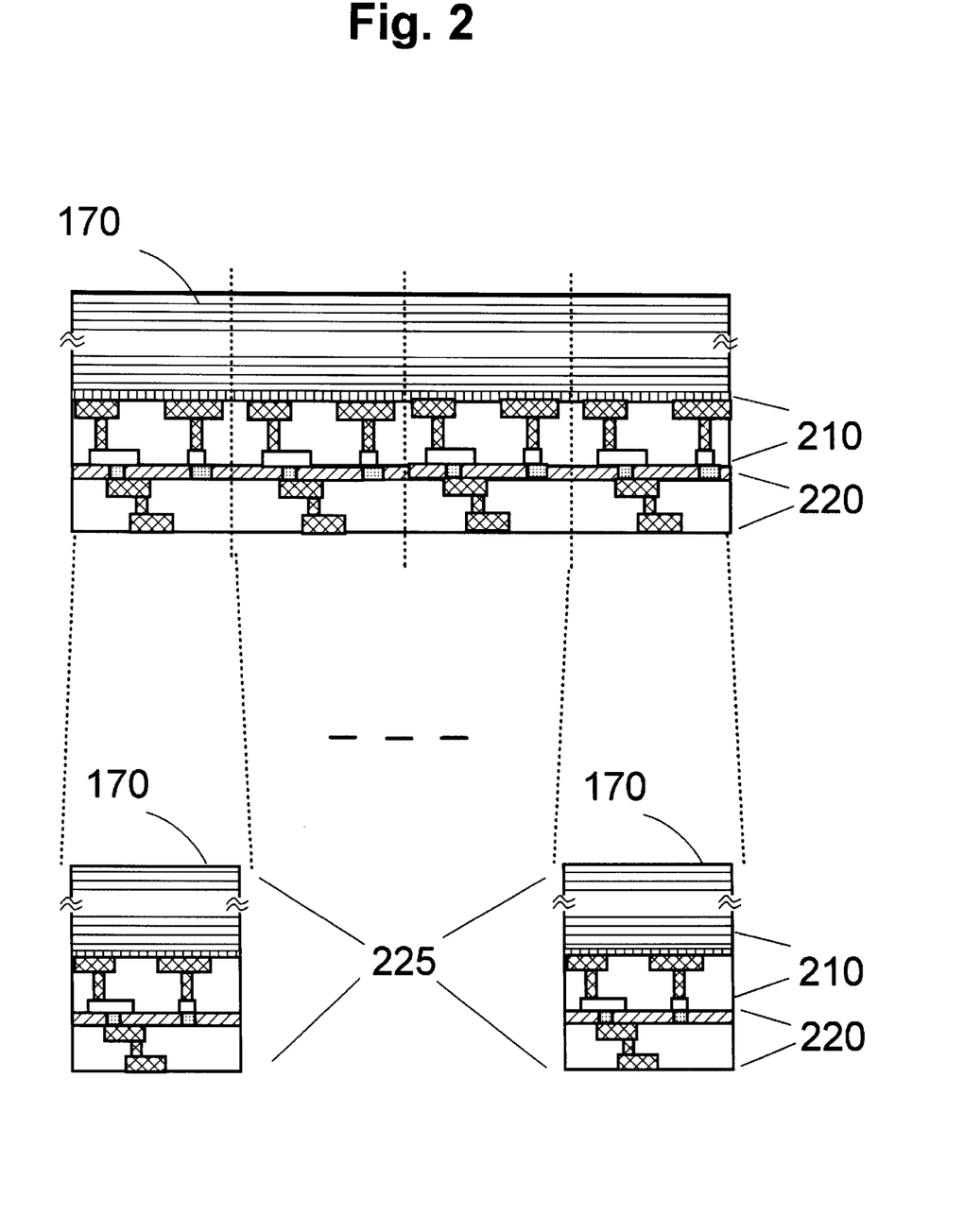
FIG. 2 illustrates the wafer shown in FIG. 1 diced into a plurality of individual chips.

Referring to FIG. 2, there is shown an SOI wafer having a handling substrate (170), frontside interconnection layers (210) and backside interconnection layers (220), as shown previously with reference to FIG. 1, with the SOI wafer now diced into individual chips (225). Wafer level testing can be performed prior to dicing in order to screen out defective chips.

Figure 3:
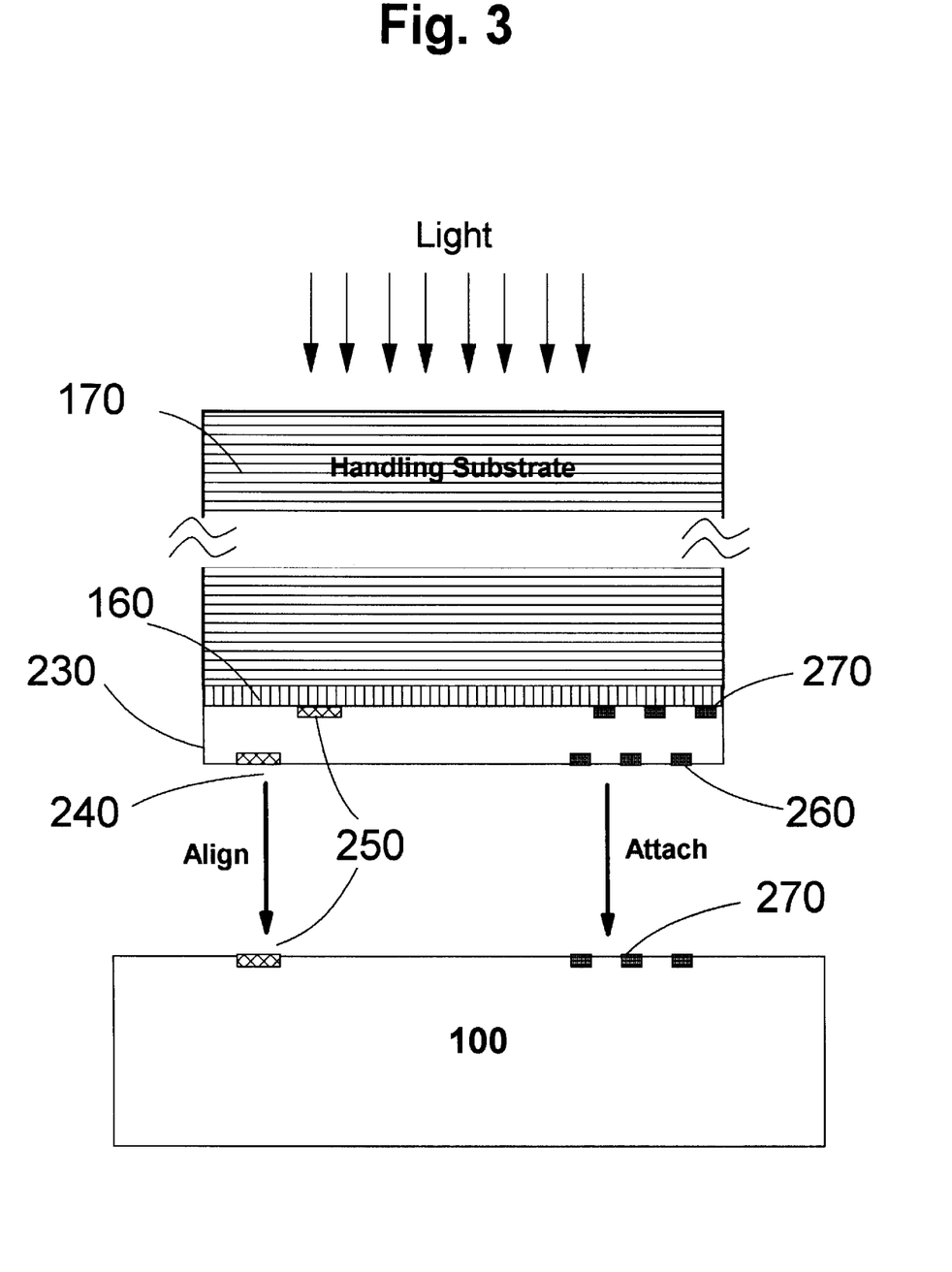
FIG. 3 shows one of the individual chips depicted in FIG. 2 ready for alignment and attached to the substrate, e.g., a SOI/vbulk chip, SOI/bulk wafer or thin-film substrate with metal routing on top of the substrate.

In FIG. 3, the individual chips are mounted, an operation that requires aligning the chips and attaching them to a substrate (100). As previously stated, the substrate is either an SOI/bulk chip, SOI/bulk wafer or thin-film substrate. In all cases, they are provided with appropriate alignment patterns (240, 250) for alignment purposes and other joint structures (260, 270) to furnish the necessary electrical connections when the chips are stacked on the substrate (100). In the case of a chip/wafer substrate, the joints (260,270) connect the circuits in the substrate to the chip attachment. In case of a thin-film substrate, the joint will attach the circuits within the chip either to the bonding pads on the substrate or to another chip that is attached onto the substrate in parallel to the first chip.

The preferred method of aligning a chip is by way of optical means. In order to actually see through the alignment at the bottom of the attaching chip, no opaque material (such as metal) should be present above the alignment mark. Since light needs to penetrate through the handler and through the layer of glue, as well as through the interlayer dielectric and buried oxide, multi-path deflections and diffractions typically are always present, which significantly impacts the accuracy of the alignment. If the number of feedthroughs between stacking chips is small (e.g., <1,000), the alignment accuracy remains at an acceptable level, particularly since the joint structure is typically quite large (e.g., >10 $\mu$m). However, in order to achieve maximum benefit from the 3-D integration, the size of the joint must remain close to the size of the metal wiring on the chip, typically, less than 1 $\mu$m. One way of attaining this goal is by using a self-aligned plug-in method which will discussed hereinafter in detail. Another approach is by means of capacitance alignment.

In this capacitance method, the chip and the substrate are brought in close proximity of each other. An AC signal is applied to selected metal patterns on the substrate. The same metal patterns are also included on the chip to achieve a perfect alignment. Assuming that the AC current induced by the chip to the substrate can be sensed, then, it is observed that the magnitude of the current increases to a maximum when the chip and substrate are perfectly aligned. Using the capacitance method, the accuracy of the alignment can be thus be further improved.

Figure 4:
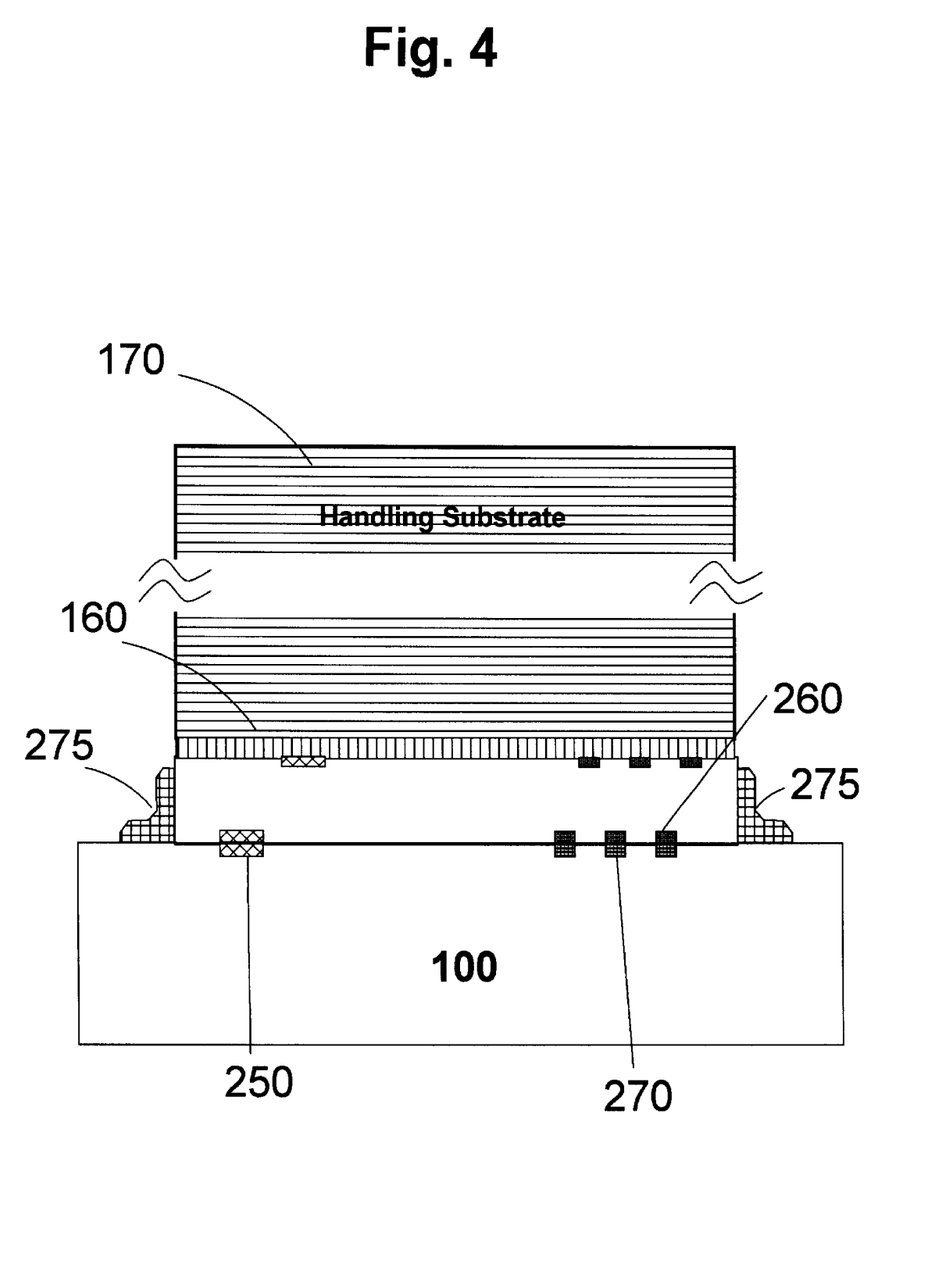
FIG. 4 shows a single chip attached to the substrate.
Figure 5:
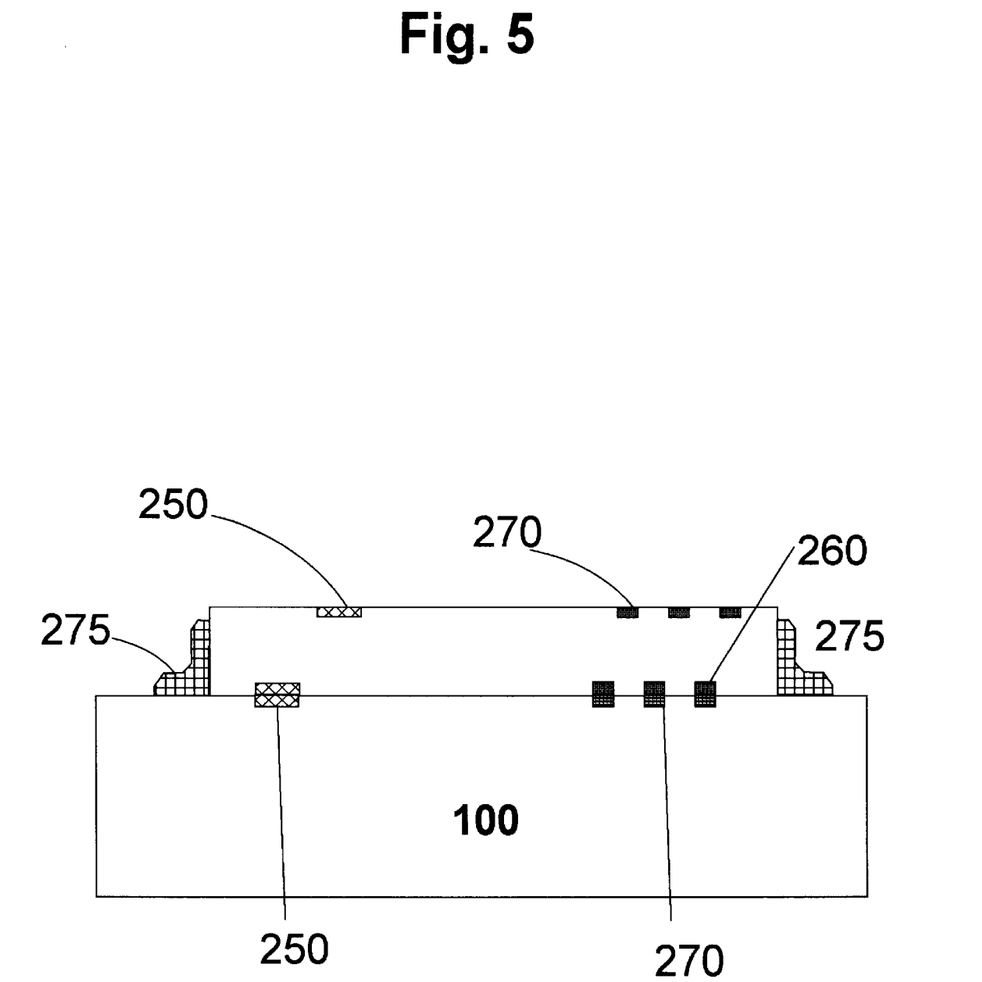
FIG. 5 shows the structure of FIG. 4 with the handling substrate removed.

Referring now to FIG. 4, after attaching the structures shown in FIG. 3, a second type of glue material (275) is pasted at the edge of the chip near the substrate surface. This second type glue (275) mechanically secures the stacking and protects the edges from any chemical process used hereinafter. Referring to FIG. 5, the handling substrate is then removed, exposing the top metal layer (210) of the stacked chip. As previously discussed, the handler can be easily removed by laser heating if the handler is made of glass and the glue is polyimide. If the chip is designed for multi-chip stacking, the same alignment pattern (250) and joint structure (270) as on the substrate are used.

Figure 6:
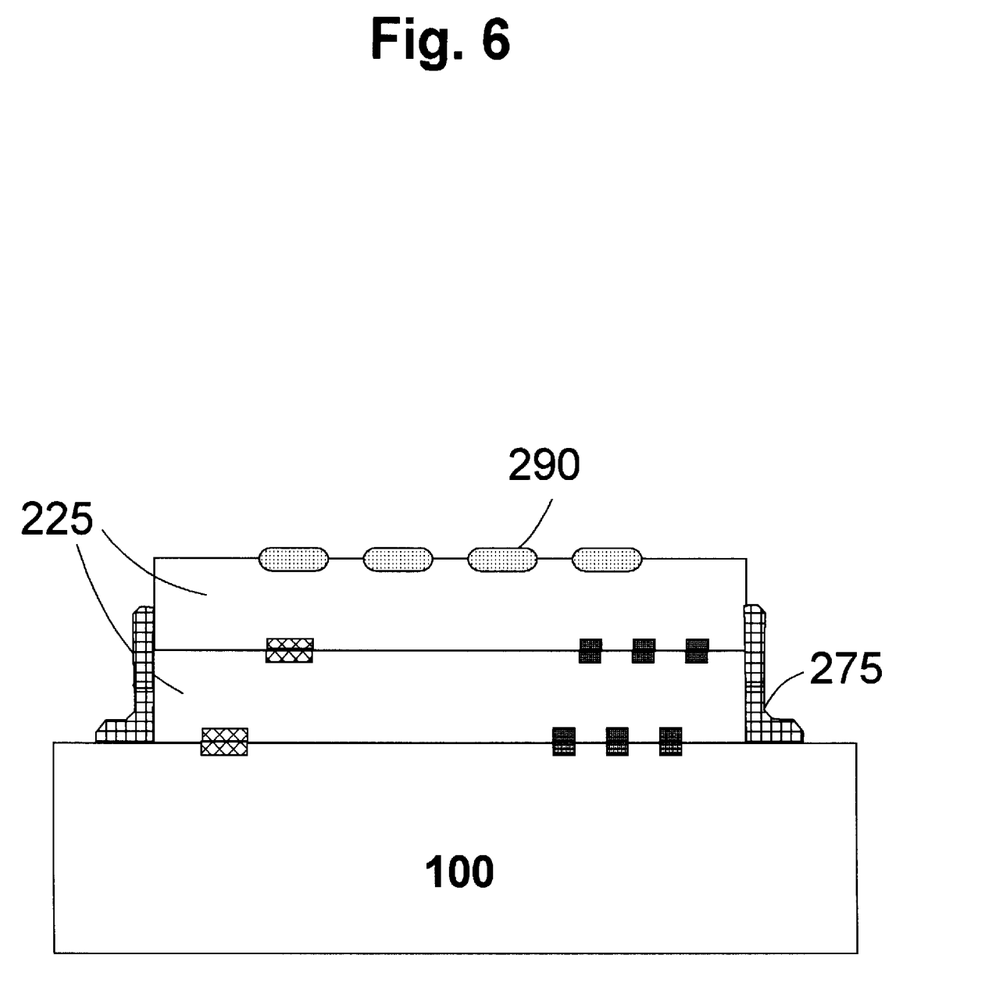
FIG. 6 shows a second chip illustrated in FIG. 2, aligned and attached from the top side of the previous structure shown in FIG. 5.

Next, a second chip (225) is mounted in the same manner as shown in FIG. 6. Again, glue (275) is pasted on the perimeter of the second chip to secure stacking and protect the edges. Chip stacking continues until the desired number of chips is reached. It is noted that if the substrate (100) is thin-film, the package wiring can be provided through bonding pads (not shown) on the substrate. If the substrate is a wafer which consists of a plurality of individual stacked chips, the wafer is diced into individual chip stacks, in which case, the top surface of the second attached chip is used for packaging. Conventional techniques such as flip-chip or C-4 packaging can be advantageously used.

Joining Method

Figure 7:
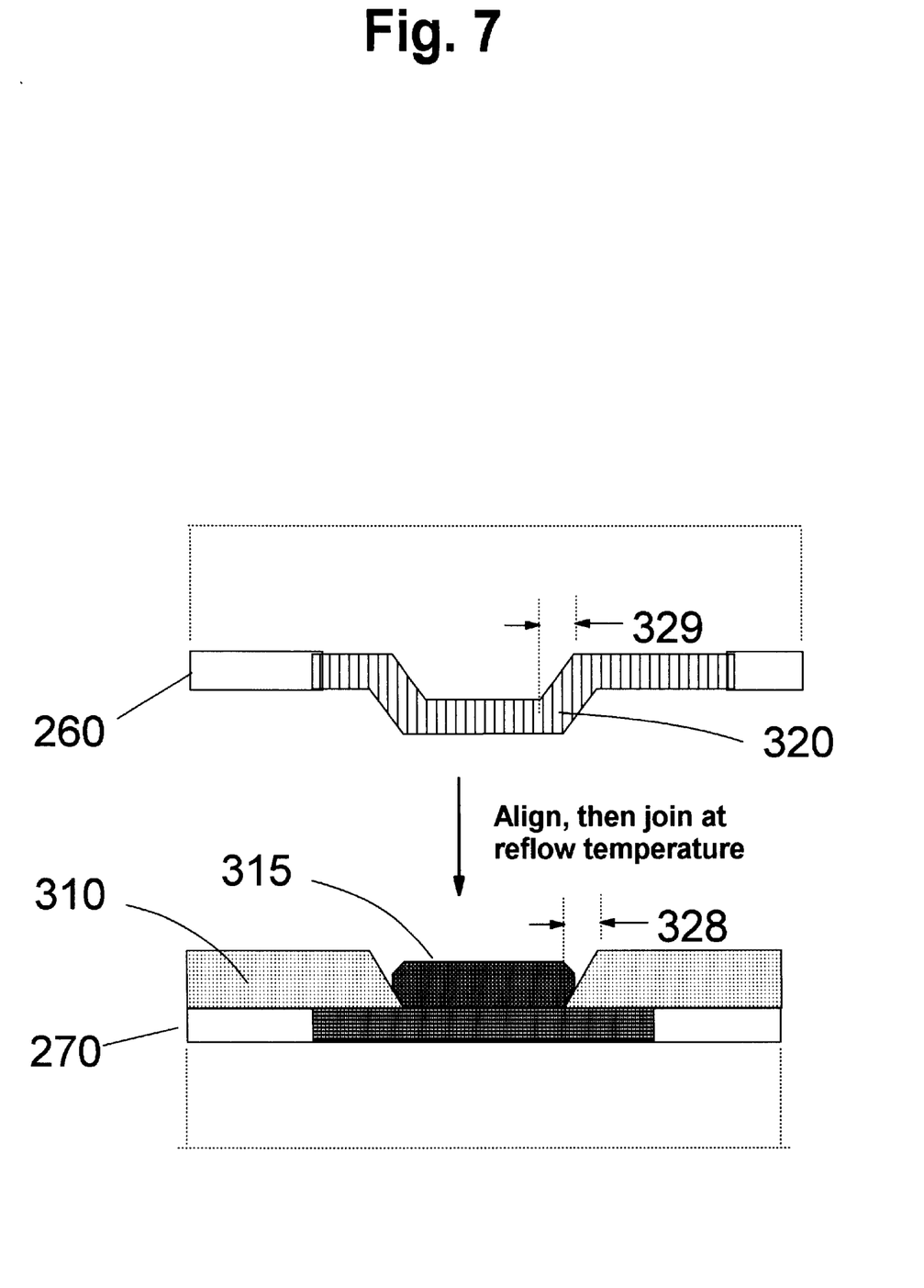
FIG. 7 is a detailed view of a joint structure shown in FIG. 6 prior to attachment.

As discussed previously, in order to improve the accuracy of the chip alignment, a self-aligned plug-in method can be used with good results. FIG. 7 shows the joint structure (260) on the substrate and chip prior to attachment. A non-conducting film (310) is deposited on the topmost layer of metal placed on the substrate. An opening is etched on the non-conducting film to expose the metal. The etching is tailored to obtain a tapered shape at the edge of the opening. Then, a solder bump (315) is deposited locally on the exposed metal within the opening. On the attaching chip, the last conducting layer (320) protrudes from the surface at a position corresponding to the joint structure on the substrate. The edge of the protruding region has the same tapered pattern as the edge on the substrate.

Figure 8:
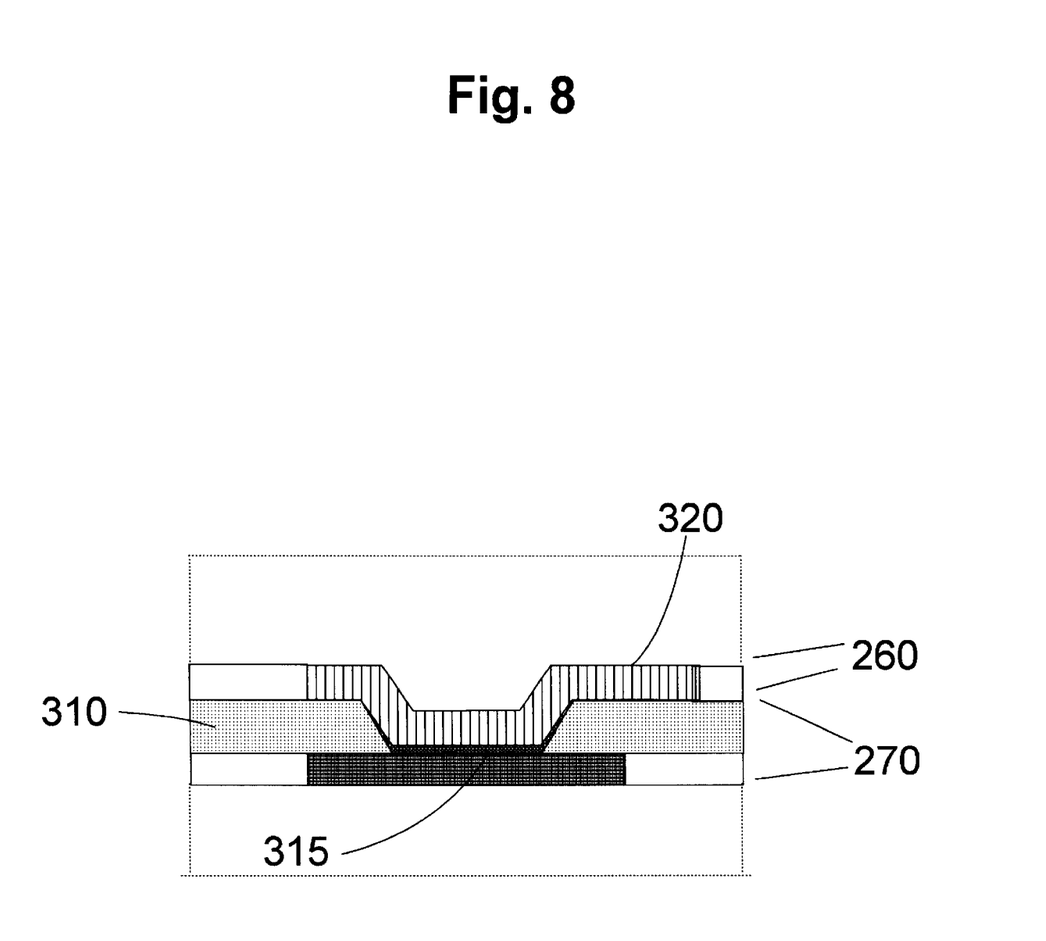
FIG. 8 shows the structure illustrated in FIG. 7 after attachment and solder bump reflow.

Attachment is carried out at a temperature which ensures that the solder bump remains in a reflow state. When the chip is brought in contact with the substrate, the alignment may still be imperfect. Let it be assumed that the alignment error is smaller than the width of the tapered edge. Then, the tapered edge on the chip makes contact with the tapered edge on the substrate. The chip is pushed downward, the tapered edges (of all the joints) self-adjust to the position of the chip relative to the substrate, and the alignment accuracy improves significantly from the original optical alignment. The solder bump reflows and fills the gap between the two joint structures, minimizing the contact resistance between the joints. The structure after joint is shown in FIG. 8.

The size of the joint structure on the chip should, preferably, be slightly smaller than the opening on the substrate in order to minimize the stress induced by stacking, if any mismatch of position or size (induced by imperfect lithography) between the joint structures were to occur.

Figure 9:
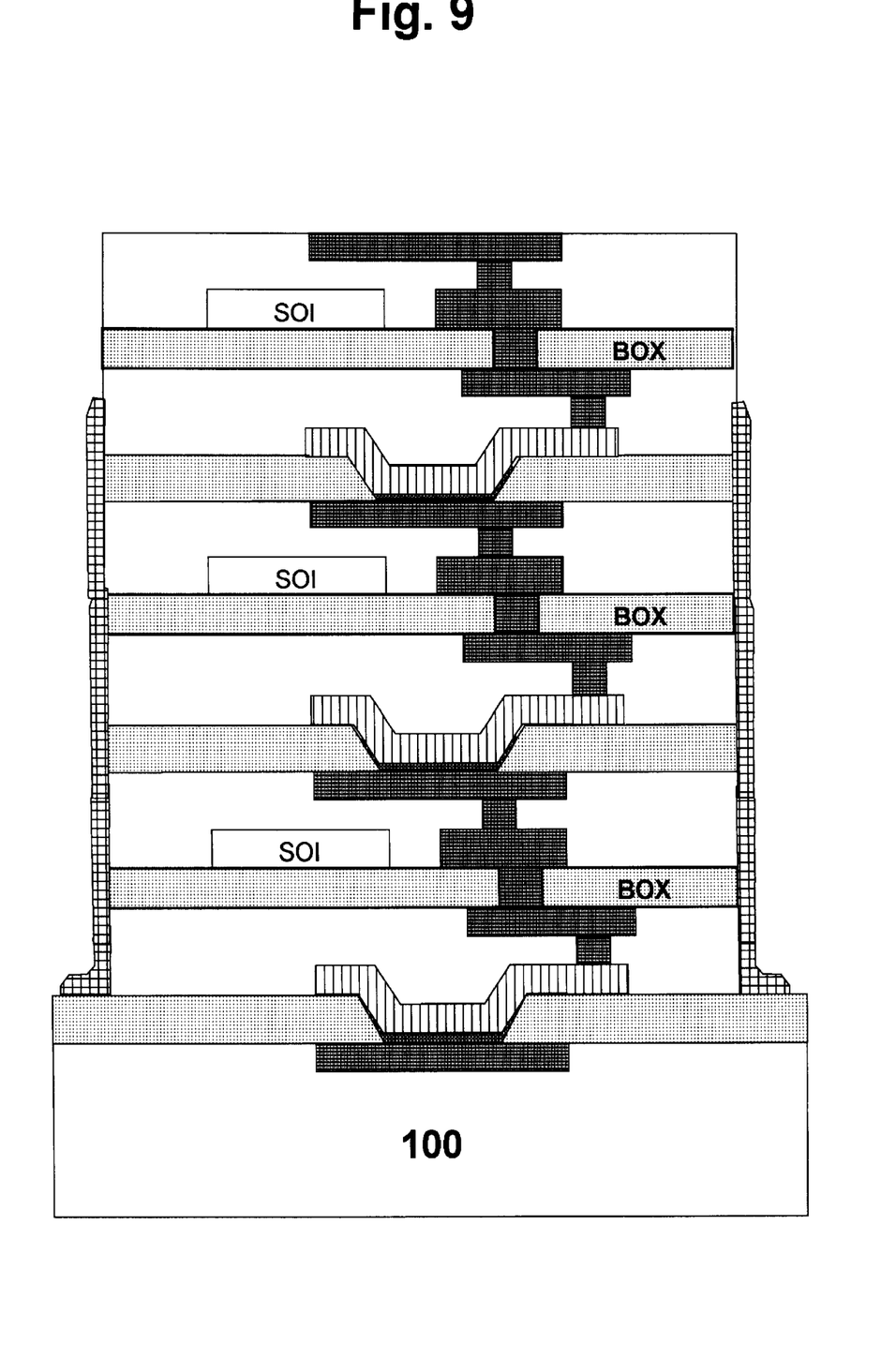
FIG. 9 shows a detailed view of a 3D stack structure in accordance with the present invention, including the attachments and solder reflow illustrated in FIG. 8.

Finally, a detailed view of a stacked structure of multiple chips, according with the present invention, is shown in FIG. 9. For sake of clarity, the joined structures are illustrated as well.

ILLUSTRATIVE EXAMPLE

If the joining structure is not much larger when compared to the metal wiring on the chips, the three dimension integration can substantially improve the performance of, e.g., a micro-processor. The logic portion of the chip should, preferably, be partitioned into different chips to be stacked together. Instead of routing only horizontally, now the metal can be routed in both, a horizontal and vertical direction. Since the distance between adjacent chips is less than 10$\mu$m, the total length of routing wires can be reduced significantly. This reduces the resistance and capacitance of the wiring and improves the performance of the processor. This performance gain improves as the number of stacking chips increases. Theoretical studies shows that the performance improves by 100% by stacking the chips fourfold.

Other potential applications are possible than just improving the routing wire length. These applications do not require a small pitch of the joint structures. Different technologies can be mixed to improve the system performance and functionality, reduce cost, lower the power consumption and achieve a smaller size of the system.

Another application is stacking memory chips. The density increases by factor of N, when N devices are stacked. The memory performance is expected to improve when the memory cells are rearranged to utilize vertical routing. Besides memory, chips from different technologies can be stacked together to generate a new generation of microelectronic product. By way of example, high performance SiGe bipolar CMOS is an ideal candidate for wireless application. Due to the extra processing steps associated with the SiGe bipolar technology, bipolar CMOS is usually not as good as the state-of-the-art CMOS only technology. By stacking a SiGe bipolar CMOS chip onto a high performance microprocessor, a single chip microprocessor with wireless interface can easily be made. Of course, memories such as FLASH, SRAM and DRAM can be stacked together to form a single chip product in a extremely compact structure with dimensions typically of the order of 10×10× 0.5 mm, and fitted in, e.g., a wrist watch. By stacking even more dies, a single chip solution can be provided for almost any application without integrating all functionality into one die.

Since the thickness of each chip is very small (less than 10μm), in principle more than 100 chips can be stacked together. Supposing 100 FLASH memory chips are stacked. The latest technology can achieve 64MB FLASH, sufficient for storing, e.g., 2 hours of music. The stacked chips can even achieve a 6.4GB, enough to store 1.2 weeks of music, or even four movies.

By stacking integrated opto-electronic chip onto a microprocessor chip, it is possible to replace slow electrical data bus with an optical interconnect bus. The optical interconnect reduces the delay of long wiring and also limits noise coupling for global wiring. In addition, the optical signals exit horizontally from the chip and are optically coupled to another chip stack. In this manner, the performance of a supercomputer can improve significantly.

Lastly, chips with only metal wiring can be stacked between two distinct product chips. It even allows stacking chips that originally were not designed with stacking in mind, i.e., wherein joint structures on the chips do not matched.

While the present invention has been described in terms of a single preferred embodiment, those skilled in the art will recognize that this invention can be practiced with numerous changes and modifications, all of which fall within the scope and the spirit of the appended claims.

Having thus described the invention, what is claimed as new and desired to secure by Letters Patent is as follows:

1. A method of fabricating a three-dimensional integrated circuit (IC) assembly, the assembly formed by a plurality of individual silicon-on-insulator (SOI) chips, each of the SOI chips comprising a handler making mechanical contact to a first metallization pattern, the first metallization pattern making electrical contact to a semiconductor device, the semiconductor device making an electrical connection to a second metallization pattern positioned on an opposite surface of the semiconductor device, the method of fabricating the three-dimensional IC assembly comprising the steps of:

a) providing a substrate having a third metalized pattern on a first surface of the substrate;

b) aligning one of the SOI chips on the first surface of the substrate, by having the second metallization pattern of the SOI chip make electrical contact with the third metalized pattern of the substrate;

c) removing the handler from the SOI chip, exposing the first metallization pattern of the SOI chip;

d) aligning a second one of the SOI chips with the first SOI chip, having the second metallization pattern of the second SOI chip make electrical contact to the exposed first metallization pattern of the first SOI chip; and e) repeating steps c) and d) for mounting subsequent SOI chips one on top of each other.

2. The method as recited in claim 1, wherein the handler is provided with a layer of glue contacting the first metallization pattern of the SOI chip.

3. The method as recited in claim 2, wherein the handler and the glue material attached to the handler are transparent.

4. The method as recited in claim 3, wherein the SOI chips are aligned by optical means.

5. The method as recited in claim 4, wherein the SOI chips are aligned by capacitive means.

6. The method as recited in claim 4, wherein the SOI chips are first aligned by optical means to attain a rough alignment followed by a second alignment by way of capacitive means, thereby achieving a precise alignment of the stacked SOI chips.

7. The method as recited in claim 1, wherein the handler is removed by laser heating.

8. The method as recited in claim 1, further comprising the step of framing the assembly of mounted SOI chips with a vertical passivation layer positioned at each edge of the assembly of stacked SOI chips.

9. The method as recited in claim 1, wherein the bottom-most one of the second metallization pattern of the SOI chip protrudes below the lower surface of the SOI chip, the protrusion having tapered edges.

10. The method as recited in claim 1, wherein the topmost first metallization pattern of the SOI chip or substrate, respectively, is indented below the top surface of the SOI chip or substrate, the indentation having tapered edges that match the tapered edges of the protrusion.

11. The method as recited in claim 9 further comprising the steps of:

a) forming solder bumps within the indented surface; and b) fitting the protrusion within the indented surface, the fitting being conducted at a temperature above solder reflow, the fitting joining the protrusion, the indentation forming a single contact when the temperature returns to room temperature.

12. The method as recited in claim 9, wherein the indentation and the protrusion are provided with a tolerance allowing any misalignment between the SOI chips mounted on top of each other.

* * * * *